(12) United States Patent
Nagelmüller et al.

(10) Patent No.: US 11,431,257 B2
(45) Date of Patent: Aug. 30, 2022

(54) POWER MODULE COMPRISING A SUPPORTING COOLING BODY

(71) Applicant: Miba Energy Holding GmbH, Laakirchen (AT)

(72) Inventors: Martin Nagelmüller, Edt bei Lambach (AT); Ratzi Raimund, Wels (AT)

(73) Assignee: Miba Energy Holding GmbH, Laakirchen (AT)

(*) Notice: Subject to any disclaimer, the term of this patent is extended or adjusted under 35 U.S.C. 154(b) by 0 days.

(21) Appl. No.: 17/058,111

(22) PCT Filed: May 24, 2019

(86) PCT No.: PCT/AT2019/060174
§ 371 (c)(1),
(2) Date: Nov. 23, 2020

(87) PCT Pub. No.: WO2019/222783
PCT Pub. Date: Nov. 28, 2019

(65) Prior Publication Data
US 2021/0219468 A1 Jul. 15, 2021

(30) Foreign Application Priority Data

May 25, 2018 (AT) .............................. A 50428/2018
May 25, 2018 (AT) .............................. A 50429/2018
(Continued)

(51) Int. Cl.
*H05K 7/20* (2006.01)
*H02M 7/00* (2006.01)
*H02G 5/04* (2006.01)

(52) U.S. Cl.
CPC .............. *H02M 7/003* (2013.01); *H02G 5/04* (2013.01); *H05K 7/2089* (2013.01); *H05K 7/20254* (2013.01); *H05K 7/20927* (2013.01)

(58) Field of Classification Search
None
See application file for complete search history.

(56) References Cited

U.S. PATENT DOCUMENTS

| | | | |
|---|---|---|---|
| 6,665,195 B1 | 12/2003 | Drabon et al. | |
| 2006/0007720 A1* | 1/2006 | Pfeifer | H05K 7/20927 363/141 |

(Continued)

FOREIGN PATENT DOCUMENTS

| | | |
|---|---|---|
| CN | 101859738 A | 10/2010 |
| CN | 103957681 A | 7/2014 |

(Continued)

*Primary Examiner* — Courtney L Smith
(74) *Attorney, Agent, or Firm* — Stoel Rives LLP

(57) ABSTRACT

The invention relates to a medium or high voltage converter (2), preferably a modular multilevel converter, as well as to a power module (1), which comprises at least one power semiconductor module (4), at least one energy storage module (5), at least one cooling device (6), and wherein the cooling device (6) is formed as a cooling plate (7) which can be run through by a coolant, in particular flown through by a cooling liquid, and which has a smaller cooling plate thickness (10) as compared to a cooling plate length (8) and a cooling plate height (9) and the cooling plate (7) has at least one support region (12) defined by the cooling plate length (8) and the cooling plate thickness (10) and/or a part of the cooling plate height (9) of the cooling plate (7), for load transfer of the power module (1) onto a rack (3) of the medium or high voltage converter (2).

20 Claims, 6 Drawing Sheets

(30) Foreign Application Priority Data

May 25, 2018 (AT) .............................. A 50430/2018
May 25, 2018 (AT) .............................. A 50431/2018
Sep. 13, 2018 (AT) .............................. A 50786/2018

(56) References Cited

U.S. PATENT DOCUMENTS

| | | | |
|---|---|---|---|
| 2010/0321896 A1 | 12/2010 | Yamada | |
| 2013/0063897 A1* | 3/2013 | Howes | H05K 7/20936 361/700 |
| 2013/0120932 A1 | 5/2013 | Tan et al. | |
| 2013/0309531 A1 | 11/2013 | Chiu | |
| 2014/0036418 A1* | 2/2014 | Eichler | H05K 7/1432 361/605 |
| 2017/0194878 A1 | 7/2017 | Jones et al. | |
| 2018/0094571 A1 | 4/2018 | Raimbault et al. | |
| 2018/0316163 A1* | 11/2018 | Jung | H02B 1/20 |
| 2019/0289753 A1* | 9/2019 | Nakamura | H05K 7/20254 |

FOREIGN PATENT DOCUMENTS

| | | |
|---|---|---|
| CN | 106329026 A | 1/2017 |
| CN | 107122527 A | 9/2017 |
| CN | 107917023 A | 4/2018 |
| DE | 1209626 B | 1/1966 |
| DE | 29813254 U1 | 10/1998 |
| DE | 202012006560 U1 | 8/2012 |
| EP | 1125355 B1 | 11/2002 |
| JP | 2015076932 A | 4/2015 |
| TW | 201742817 A | 12/2017 |
| WO | 2004082348 A2 | 9/2004 |
| WO | 2008074274 A1 | 6/2008 |

* cited by examiner

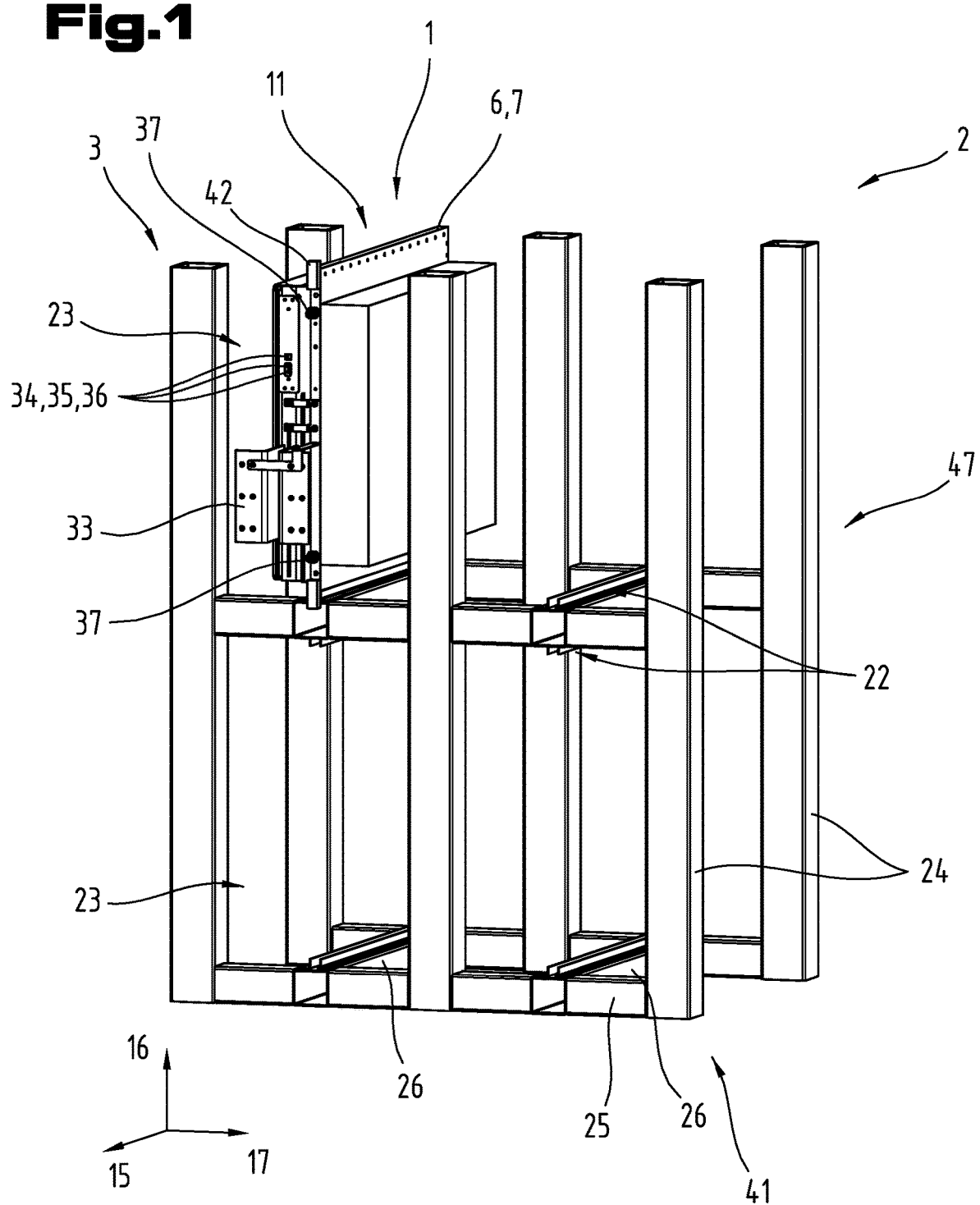

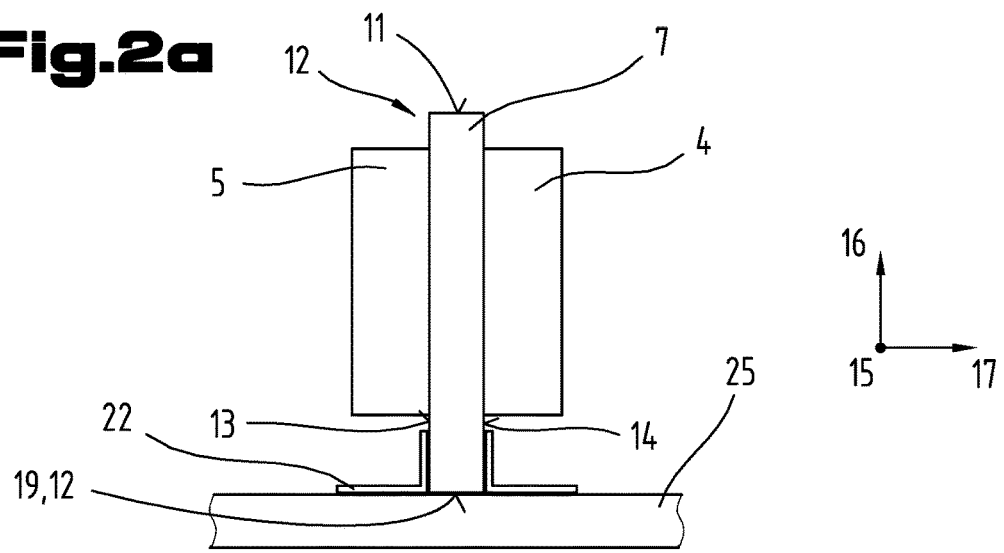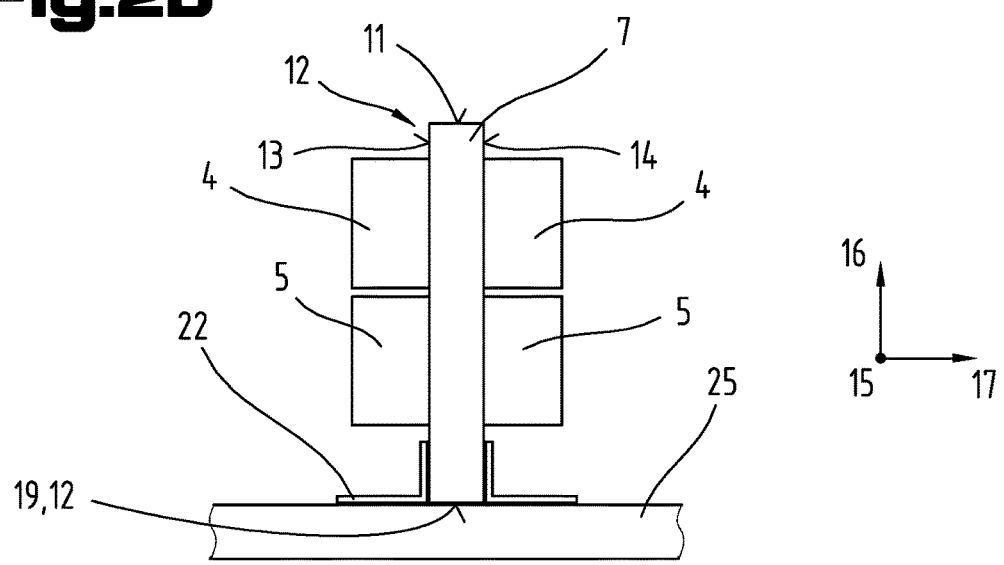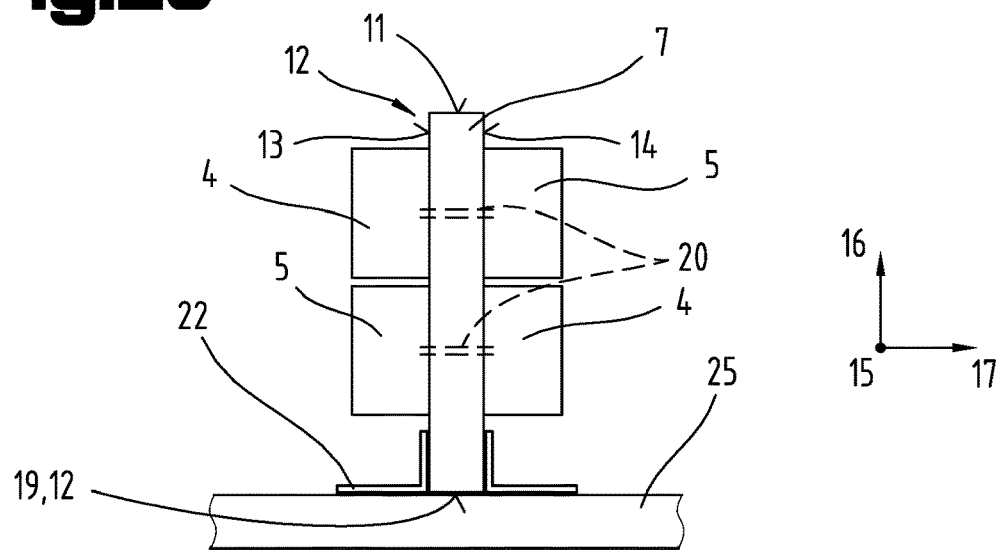

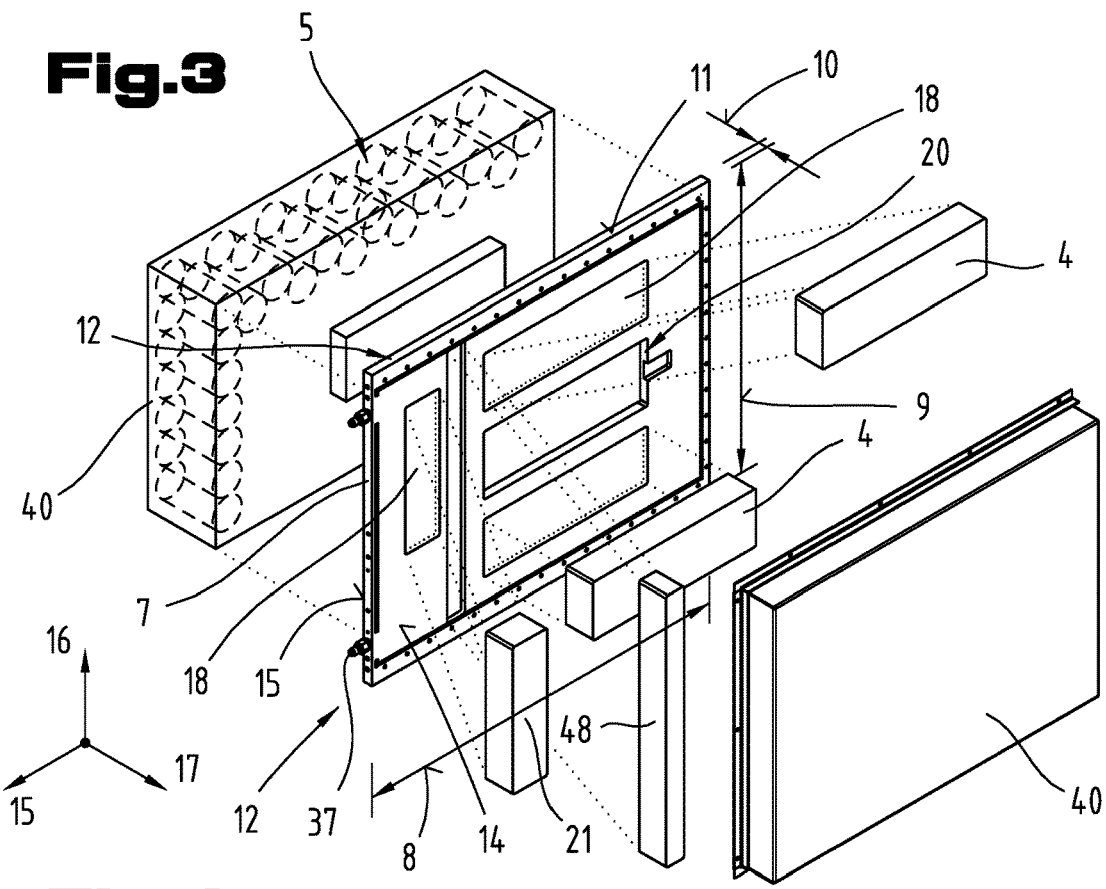
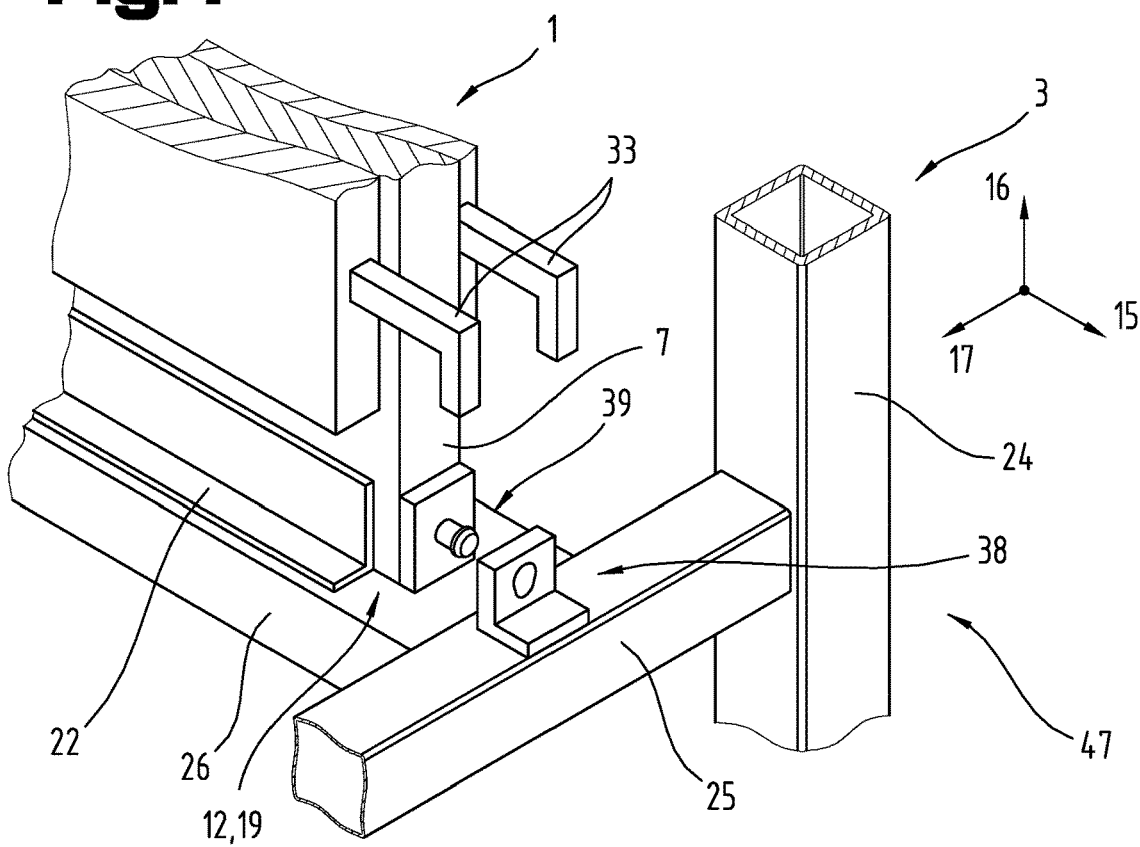

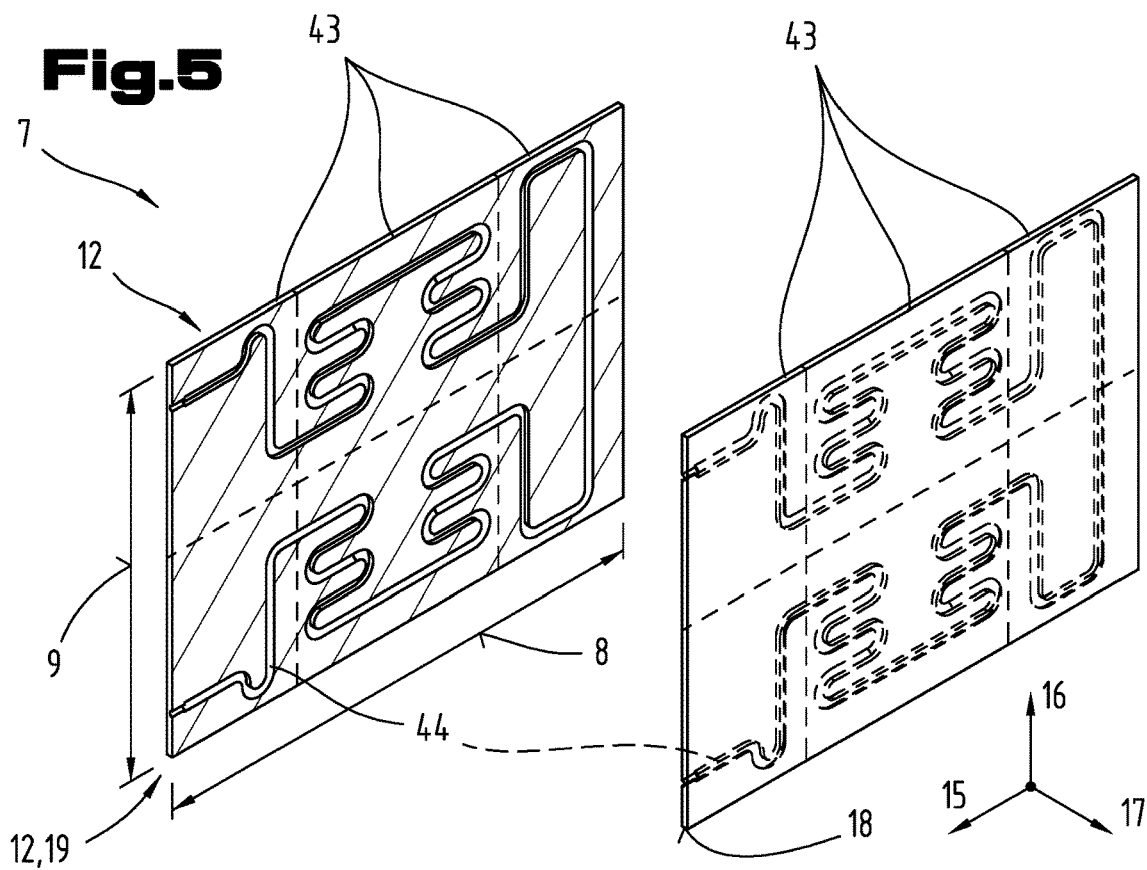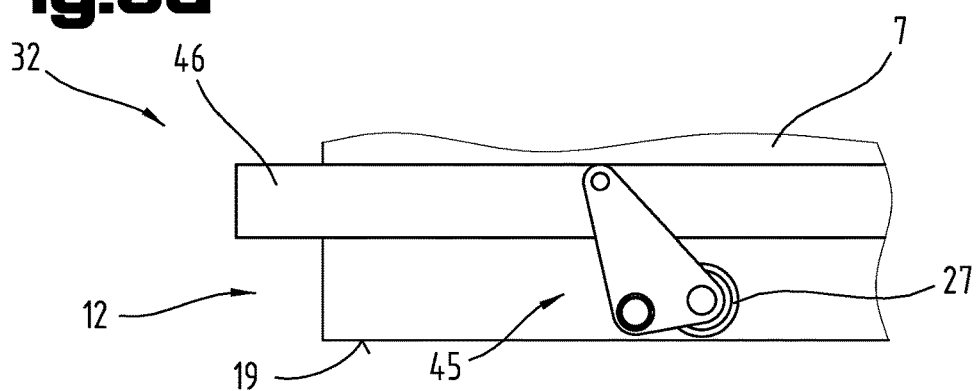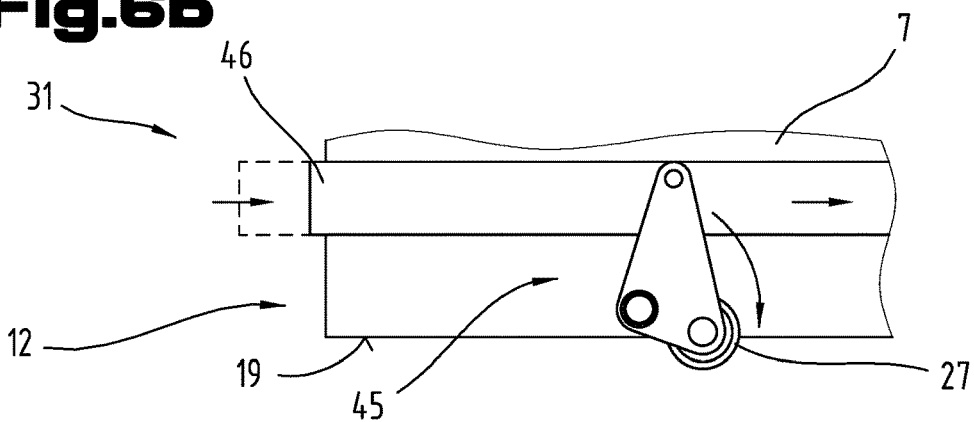

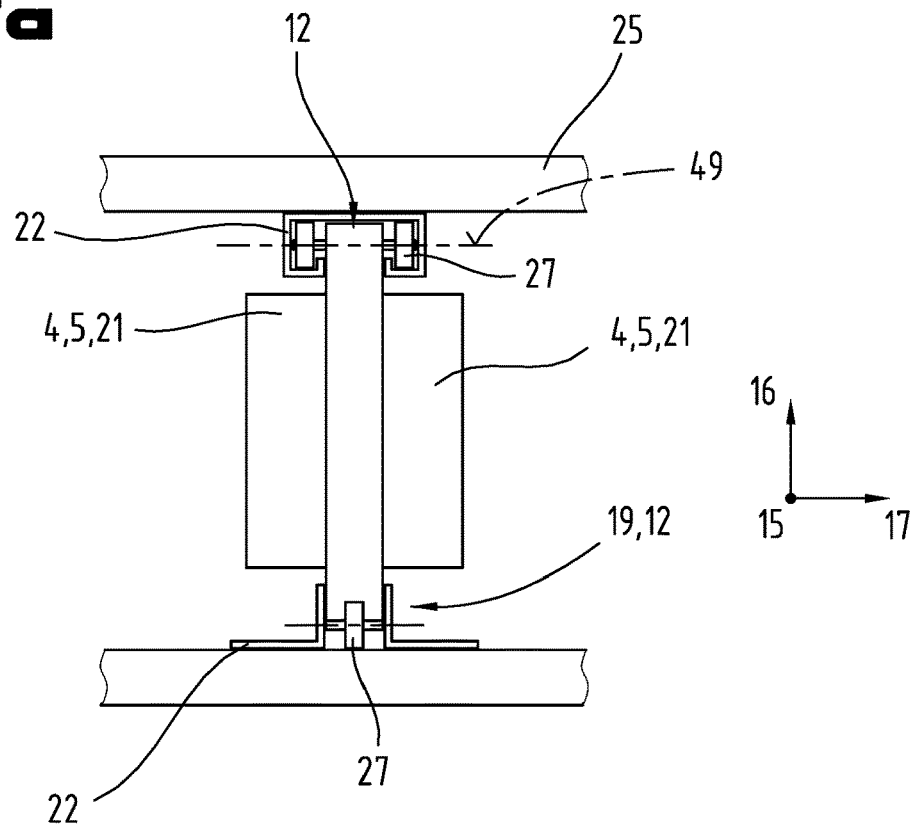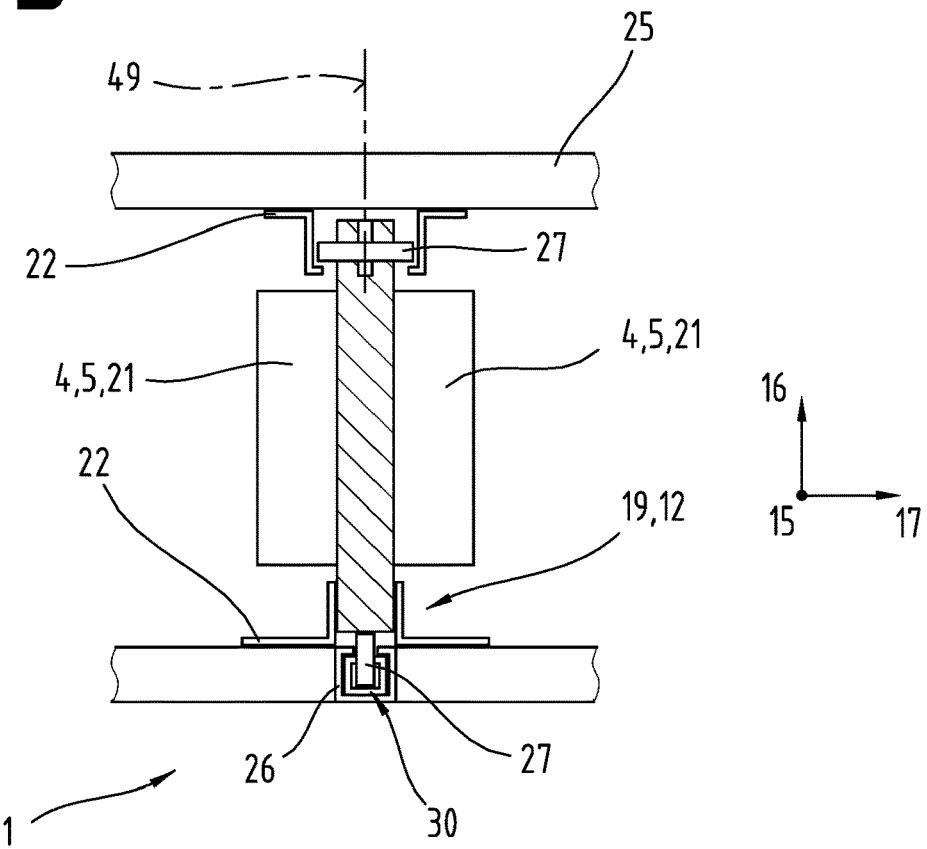

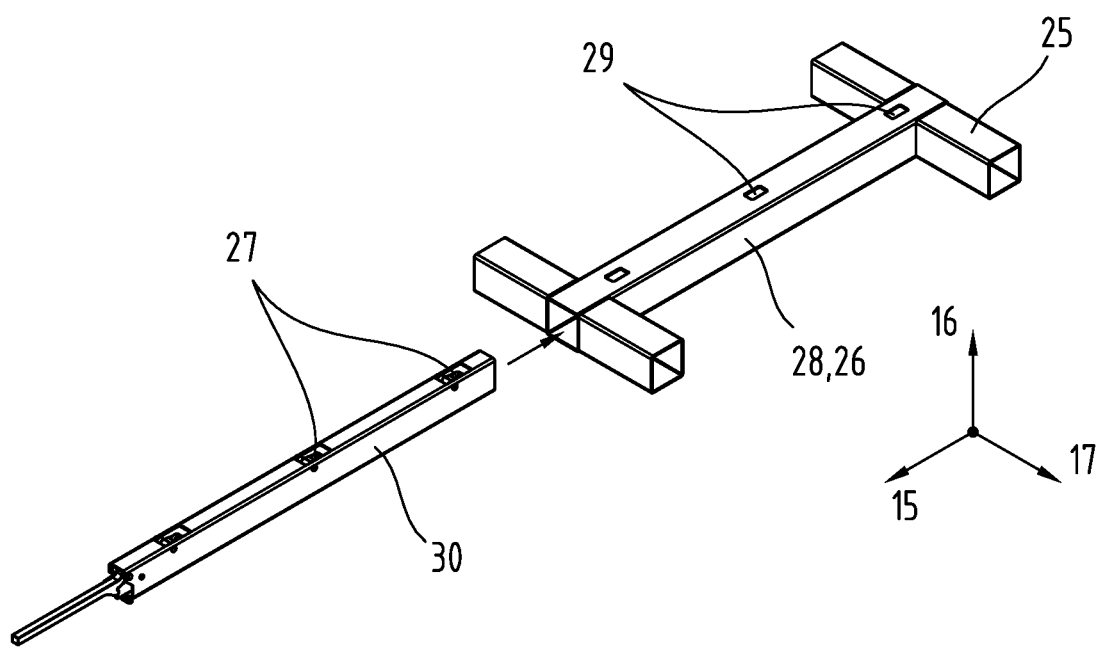

POWER MODULE COMPRISING A SUPPORTING COOLING BODY

This application is a national stage under 35 U.S.C. § 371 of International Application No. PCT/AT2019/060174, filed May 24, 2019, which claims priority of Austrian Patent Application Nos. A50428/2018, A50429/2018, A50430/2018, and A50431/2018, all filed May 25, 2018, and Austrian Patent Application No. A50786/2018, filed Sep. 13, 2018.

The invention relates to a power module for a medium or high voltage converter, preferably a modular multilevel converter (MMC), which comprises a cooling device configured as a cooling plate, which has at least one support region for the load transfer of the power module onto a rack of the medium or high voltage converter. The invention further relates to a medium or high voltage converter having a correspondingly configured power module.

Modern medium or high voltage converters usually comprise a plurality of interconnected power modules, such as MMC sub-modules, for converting an alternating voltage into a direct voltage or vice versa. Such power modules can also be referred to as sub-modules, in particular in modular multilevel converters. In this regard, the person skilled in the art knows a plurality of possible arrangements of energy storage modules, power semiconductor modules, associated control devices and in particular cooling devices provided for cooling these elements.

WO2008/074274A1 discloses a multilevel converter having converter modules which have a plurality of power semiconductors and a plurality of energy storages, wherein at least one converter is mounted on an energy storage such that it is load bearing. For the formation of the modular multilevel converter, such multilevel converters are arranged in a rack, such that the energy storage is supported on cross struts of the rack on its front and rear side. A quick exchange of the power module is complicated by the fact that the power module in a standing arrangement has to be lifted in a relatively elaborate manner and transferred out of and/or into the rack. In such arrangements, furthermore, relatively long connecting elements and/or connecting lines are required for contacting the connections for power means, control means and/or coolants, these having a negative impact on accessibility for the user.

US2017194878A1 discloses a possible structure for a power module and/or a sub-module of a multilevel converter, which provides that a power semiconductor module of the power module is at least partly arranged directly or indirectly on a cooling plate. For mounting such a power module in a multilevel converter, however, a relatively complex frame construction for holding the individual components of the power module is required so as allow for load transfer onto a rack of a multilevel converter. Moreover, the disclosed construction has the disadvantage that the energy storage unit is arranged on the semiconductor unit in the vertical direction, which reduces the cooling effect of the cooling plate onto the energy storage unit.

EP1125355B1 discloses a converter capacitor module formed as the load-bearing component. The capacitors are mounted above power semiconductors which results in the disadvantage of a reduced heat dissipation of the cooling body arranged at a distance from the capacitors.

US 2010/321896 A1 discloses an electrical power component which is mounted on a chassis of an electrical power device, including a semiconductor element, which forms an electronic circuit, and a cooling unit having a planar shape, which cools the semiconductor element, and which cooling unit simultaneously serves as a reinforcement material for increasing the strength of the chassis by means of multiple threaded connections to a chassis.

The person skilled in the art knows further arrangements for power modules in which the energy storage module is arranged in the longitudinal direction between the semiconductor module and/or control module. Predominantly, in this regard, the largest length extent of a power module is formed in the vertical direction, whereby multiple power modules can be arranged next to or one above the other in a rack to form a modular converter; however, this results in a relatively elevated center of gravity.

The increasing demands on safety, especially explosion protection, operator safety and electromagnetic compatibility (EMC) go hand in hand with the requirement for cost-effective production of the power module. Moreover, quick and comfortable exchangeability of a power module in case of damage is desirable. Moreover, an individual adaptability of a power module to the respective local requirements of a medium or high voltage converter to stationary plants would be desirable or would be of practical advantage for the use at movable installation places, such as on a train or ship.

The object of the present invention was to overcome the disadvantages of the prior art and to provide a power module representing a simple, cost-effective, secure and quickly exchangeable platform solution. A further object of the invention was to ensure a good heat dissipation and to improve the EMC of the power module and/or of the medium or high voltage converter.

This object is achieved by means of a power module and a medium or high voltage converter according to the claims.

The power module according to the invention for a medium or high voltage converter, preferably a modular multilevel converter, comprises at least one power semiconductor module, at least one energy storage module and at least one cooling device. The cooling device is configured as a cooling plate that can be flown through by a coolant, in particular flown through by a cooling liquid, which cooling plate has a smaller cooling plate thickness, compared to a cooling plate length and a cooling plate height, and has at least one support region defined by the cooling plate length and cooling plate thickness and/or a part of the cooling plate height of the cooling plate, for the load transfer of the power module onto a rack of the medium or high voltage converter.

By the formation of the power module, in particular of the cooling device as a load-bearing construction element according to the invention, a support function of the power module on the rack is effected at the same time and a receiving platform for all modules arranged on the cooling body is formed. The cooling plate thus serves as a kind of mounting plate to accommodate the energy modules, power semiconductor modules and potential other components. Such components can for example be arranged on the cooling plate in the form of an auxiliary module and can for example comprise a controller, power supplies, bypass circuit, resistors and the like.

The power semiconductor module preferably comprises an IGBT assembly, MOSFETs, transistors or the like. The energy storage module preferably comprises a capacitor module, which can comprise a plurality of capacitors, and/or other useful energy storages. The connection of the individual components by means of suitable conductor elements, such as busbars, cables or the like, is sufficiently known to the person skilled in the art and is thus not elucidated in further detail.

Such a power module thus has a substantially vertically oriented cooling plate which supports itself on the rack in at least one support region in a load-transferring manner. The support region can be provided in the region of the upper side of the cooling plate and/or the bottom side of the cooling plate, which leads to application-specific advantages for the person skilled in the art, which become apparent, e.g. in a very space-saving arrangement of multiple power modules in a rack and/or of a receiving space of the rack similar to a "plug-in card principle". The length extension of the power module is essentially given by the cooling plate length and is substantially greater in the longitudinal direction than in the vertical and/or transverse direction. By choosing a suitable arrangement of the electrical components of the power module, in particular of the at least one energy storage module, the position of the center of gravity may be selected relatively low.

The teaching of the present invention can, if necessary, also be transferred to the low voltage range.

It has proven particularly advantageous that the cooling plate has a ratio of the cooling plate length in the longitudinal direction to the cooling plate height in the vertical direction ranging from 5:1 to 1:2, in particular ranging from 2:1 to 1:1, in each case being greater than the power module height in the transverse direction. This significantly reduces the danger of the power module tilting during maintenance work or a change and still allows the realization of a very compact power module.

A medium or high voltage converter according to the invention, preferably a modular multilevel converter, comprises at least one power module as described above and hereinafter, and at least one rack having a plurality of vertical standing members and horizontal beams, which are arranged for connecting to at least two vertical standing members each, and which rack has at least one receiving space for at least one power module, wherein at least one longitudinal beam is arranged so as to connect at least two horizontal beams for the load transfer of the power module.

This allows a relatively "slim" and material-saving structure of the rack without compromising the stability. In this regard, the longitudinal beams are designed for the load transfer of at least one power module. In this manner, the longitudinal beams simultaneously have a carrying function for the power module and a connecting function for the horizontal beams of the rack. It can also be provided that multiple power modules are arranged in a common receiving space, which could lead to savings regarding costs and/or space requirements.

Furthermore, it can be useful if at least one horizontal beam and/or longitudinal beam are made from an electrically insulating material, preferably a glass fiber composite material.

In this manner, an insulation of the individual power modules from one another by the rack can be achieved, which contributes to an increase of the safety in case of a short circuit. For cost reasons, it can also be envisaged to configure the vertical standing members from a different, possibly electrically conductive construction material, as the insulation can be significantly determined by the longitudinal and/or horizontal beams.

In arrangements of the components of the power module that are thoroughly discussed below, the position of the center of gravity can be optimized by a suitable embodiment of the support region of the cooling plate. In this regard, the load transfer can be realized according to the invention by supporting the cooling plate downwardly and/or in a type of hanging arrangement on at least one support region, which leads to a greater design freedom for the person skilled in the art. Furthermore, a good thermal connection of the heat-dissipating components to the cooling plate can be accomplished, and a homogenization of the electrical conduction paths can be achieved by the power module formed according to the invention, whereby the EMC can be improved.

Furthermore, it can be provided that the at least one support region for the supporting load transfer onto the rack, substantially downward in the vertical direction, is designed as a support surface, preferably comprising at least the cooling plate length and cooling plate thickness.

The support region can therefore include, in the region of the bottom side of the cooling plate, the downward footprint of the cooling plate as well as a part of the side surfaces connecting in the vertical direction. Preferably, the support surface extends across the entire cooling plate length, whereby the surface load of the power module on the longitudinal beam can be reduced locally. The preferably flat load transfer of the power module via the support surface makes a very stable position and/or guide as well as a relatively easy handling of the power module possible.

Moreover, it can be provided that the at least one support region for the load transfer onto the rack is formed in the region of an upper side of the cooling plate, preferably comprising at least the cooling plate length and a part of the cooling plate height.

Such an embodiment of the support region can be realized in an independent manner or also in connection with the aforementioned support surface on a power module. A support region on the cooling plate upper side can thus be used for performing the load transfer onto a longitudinal beam arranged above it in the vertical direction. The load transfer can take place by means of suitable rolling bodies and/or sliding elements for forming a kind of "hanging power module", whereby the position of the center of gravity of the power module in the vertical direction is of minor significance, and a stable mounting in the rack can be achieved.

The cooling plate having at least one receiving surface for arranging at least one power semiconductor module or at least one energy storage module each on both sides defined by the cooling plate length and the cooling plate height of the cooling plate, is also advantageous.

Such receiving surfaces, however, do not have to extend across the entire cooling plate height and/or length, but can each make up only a part of the side surfaces. On these receiving surfaces, the individual electrical components, in particular the at least energy storage and/or power semiconductor module, can be arranged directly on the cooling plate so as to be thermally conductive. This allows a highly efficient heat dissipation. Also, the cooling plate can be optimally used following the basic idea of a mounting platform.

This embodiment also allows a plurality of possible arrangements for being able to set a good weight distribution and/or position of the center of gravity. By way of example, it is conceivable here to arrange the at least one power semiconductor module as well as the at least one energy storage module on a side of the cooling plate or also on opposing sides of the cooling plate. Likewise, combinations of multiple energy storage and/or power semiconductor modules that are independent of one another on a common cooling plate are conceivable, whereby, in simplified terms, it is made possible to form multiple functional power modules by means of a common cooling plate.

According to a further embodiment, it is possible that the cooling plate comprises at least one connection opening in the transverse direction for leading through and contacting at least electrical connections of the at least one energy storage module to the at least one power semiconductor module and/or at least one auxiliary module.

In this regard, the connection opening cuts through the cooling plate in the transverse direction. This can efficiently avoid having to guide the current-carrying lines around the cooling plate in a complicated manner. Thus, with the aid of such connection openings, very short electrical conduction paths can be obtained, whereby a homogenization of capacitive and/or inductive disturbances and even their avoidance can be achieved. This favors the electromagnetic compatibility of the power module and/or the medium or high voltage converter. The arrangement of this at least one connection opening can, according to demand, be selected on the cooling plate, although it is preferably positioned in the center in the vertical direction.

Moreover, the at least one power semiconductor module is arranged on the first side, and the at least one energy storage module is arranged on the second side of the cooling plate opposite the first side.

Taking into account the above discussion, this embodiment allows to locally separate the energy storage module from the power semiconductor module. This may be particularly advantageous in case of damage to a power module which is caused by faulty power semiconductors. In case of high voltages in the medium or high voltage converter, the failure of one or multiple power semiconductors oftentimes happens in an explosive manner, developing pressure, dust and/or heat. By spatially separating the at least one power semiconductor module from the remaining electrical components by means of the cooling plate, an explosion protection can be realized and thus, the safety of operation can be improved.

Furthermore, it can be provided that at least one retaining element corresponding with a coupling device of the rack is arranged on the cooling plate.

The retaining element of the cooling plate can be configured as an extension, preferably as a pin having a groove or a pin having a head that is broadened with respect to a pin diameter, or also as a recess, preferably as a notch, groove or the like. The coupling device on the rack is configured analogously thereto, meaning in particular complementary in form and function. In this regard, the coupling device can be configured to be "active", for example via a separate actuation mechanism, or also "passive", for example as a locking element. In this manner, the at least one retaining element can serve as a centering aid and/or end stop in the longitudinal direction, whereby damages during the change can be avoided. Likewise, this embodiment makes an automatic, meaning "passive" and/or "active" arresting of the power module on the rack possible, which allows to increase the security of the power module against falling out and/or tilting, like e.g. in case of an earthquake. The retaining element is preferably arranged on the rear side of the cooling plate.

Furthermore, it can be provided that the power module has at least one protective housing for accommodating at least one power semiconductor module and/or auxiliary module and/or energy storage module, which protective housing is designed so as to be affixable, preferable couplable, to the cooling plate.

Such a protective housing can significantly increase the security of the electrical components against external influences such as dust, fluids etc. Moreover, such a protective housing can consist of multiple partial protective housings which possibly have different heights. This allows a protection of the individual components in case of damage and/or explosion and can additionally allow a very compact construction of the power modules.

According to a particular embodiment, it is possible that at least one bulkhead partition element is arranged so as to separate at least two components such as power semiconductor module and/or the auxiliary module and/or the energy storage module, and so as to connect the cooling plate to the at least one protective housing.

Separating the components, in particular the power semiconductor section from the auxiliary module, by forming the at least one bulkhead partition can efficiently reduce or even completely avoid a gas and/or particle admittance into the section of an adjacently arranged component in case of an explosion. Usefully, such a bulkhead partition element has passages, complementary in form, for possible electrical and/or control and/or measuring connections and/or lines.

According to an advantageous further development, it can be provided that at least two electrical connections and/or control connections and/or coolant connections and/or possible measuring connections and/or auxiliary connections are formed on a front side of the power module.

By this measure, a very good accessibility of the connections of the power module is ensured for the operator. A simple, fast and safe connection and/or disconnection of the connections can thus be achieved. In this regard, the coolant connections are preferably designed as quick-release connectors, whereby the speed of the change of a power module can be increased.

Likewise, it is conceivable that at least two electrical connections and/or control connections and/or coolant connections, preferably formed as quick-release connectors, and/or possible measuring connections and/or auxiliary connections are formed on a rear side of the power module.

In this manner, the power module can be moved into the receiving space of the rack, similar to a "plug-in card principle" of a PC. Advantageously, the cooling plate is formed so as to protrude beyond the electrical components and/or their protective housing in the longitudinal direction toward the rear side. The connections mentioned by way of example can be designed so as to be complementary to supply platform arranged on the rear side of the rack, whereby a, preferably automatic, coupling and/or decoupling can be achieved. This facilitates the operation and can increase the safety of operation as the incorrect operation of connections can be avoided.

In particular, it can be advantageous if, on the front side of the cooling plate, at least one stop element is arranged so as to protrude beyond the cooling plate height in the vertical direction This measure can serve as a depth stop of the power module and ensure the correct positioning of all connections in a predeterminable and/or defined position. Additionally, connections arranged on the rear side prevent the danger of damage.

Moreover, it can be provided that the cooling plate is assembled of at least two cooling plate segments divided in the longitudinal direction and/or the transverse direction and/or the vertical direction, for the formation of a continuous coolant channel.

The formation of the cooling plate by assembling multiple cooling plate segments allows for easy modular construction of the cooling plate, whereby, according to the platform idea of the present invention, a simple demand-oriented adaptation to the arrangement of the power semiconductor module and/or the energy storage module can be carried out on the cooling plate. In the simplest case, a cooling plate can be formed by connecting two horizontally divided cooling plate segments, wherein at least one cooling plate segment comprises a recess for a coolant channel. The cooling plate segments can be connected to one another by means of suitable connecting elements. Soldered connections are also conceivable in this context. To increase the solidity, the cooling plate segments can be connected by means of a welding connection. In particular in cooling plates made of aluminum or aluminum alloys, a connection of the cooling plate segments to one another by means of friction stir welding has proven advantageous.

Moreover, it can be provided that at least two cooling plate segments have different cooling capacities.

Hence, it becomes possible to optimize the local heat dissipation through the cooling plate. The measures described above thus allow a local adaptation of the heat dissipation capacity according to the predeterminable arrangement of in particular power semiconductors and/or energy storages on the cooling plate. For example, in the case of the standing construction of the cooling plate according to the invention, a higher degree of heat dissipation in the region of power semiconductor modules arranged above the energy storage module can be advantageous, whereby additionally the center of gravity can be advantageously selected at a lower point. Moreover, such a formation of the cooling plate may result in a cost-effective design.

In addition to this, it can be provided that at least one cooling plate segments, for the formation of a continuous coolant channel in the assembled state of the cooling plate, comprises a coolant channel recess for receiving a coolant line complementary in shape, which is enclosed by the cooling plate in the assembled state of the cooling plate.

An embodiment, according to which it can be provided that the cooling plate is designed so as to protrude in the vertical direction relative to the at least one power semiconductor module and/or the at least one energy storage module and/or the at least one protective housing, is also advantageous.

Such protruding projections can be used for an improved safety of the longitudinal movement of the power module during an exchange. Such projections preferably comprise the at least one support region and can simultaneously serve the lateral support of the power module in the transverse direction on guide elements of the rack provided therefor, whereby the stability of the position of the power modules can be increased.

Analogously to this, it is possible that at least one longitudinal beam of the medium or high voltage converter has at least one guide element for guiding and/or elevating the positional stability of the cooling plate, in particular of the support region, at least in the transverse direction.

Such guide elements can be arranged on an upper and/or bottom side of the longitudinal beam. They can be used for lateral and/or vertical support and allow a quick and safe power module change.

According to a further development, it is possible that at least one guide element is configured as a Z-shaped, L-shaped, C-shaped or U-shaped profile element on a bottom side of at least one longitudinal beam for accommodating the support region and/or for guiding the cooling plate.

This measure is useful particularly in case of a bottom-side arrangement for the vertical load transfer into the rack. A "hanging" arrangement of the power module can be realized in a simple and cost-effective manner with the aid of such guide elements. It is equally conceivable that such guide elements have rolling bodies and/or sliding elements which facilitate a movement of the cooling plate and/or of the support region.

Furthermore, it can be useful if the cooling plate has at least two rolling bodies in the support region. The rolling bodies can be formed on or inside the cooling plate or a rolling body receptacle provided therefor.

A plurality of rollers in the support region can effectively facilitate the movement of the power module, whereby particularly the safety and speed during a change can be increased.

In this process, it is possible that the at least two rolling bodies are arranged on the support surface of the cooling plate and preferably can be designed so that they can be adjusted so as to protrude in the vertical direction with respect to the support surface.

Such rolling bodies, which are arranged substantially on the bottom side of the cooling plate, are very well-protected against contamination and/or corrosion. In this regard, it is preferably possible that the rolling bodies can be adjusted between a service position and a rest position by means of a lever mechanism integrated into the cooling plate and/or the support region. In this process, the rolling bodies protrude beyond the support surface when in the service position, whereby a movement of the power module is made possible, while they can be recessed behind the support surface, back into the cooling plate, when in the rest position. The power module is thereby slightly raised in its entirety in the service position and/or secured against movement, when in the rest position, by the flat contacting of the support surface on the guide element and/or the longitudinal beam. The rolling bodies are arranged within the support region so as to be spaced apart from one another in the longitudinal direction. The joint adjustment of the rolling bodies and/or the actuation of the lever devices can take place via e.g. a common coupling rod and can be performed by applying a force in a manual or also motorized manner.

It is also possible to arrange the at least two rolling bodies laterally in the support region, for instance on the first and/or second side of the cooling plate.

Rolling bodies arranged in such a manner can preferably be arranged in the region of the cooling plate upper side in the support region in order to realize e.g. a "hanging" arrangement of the power module. In this case, the rotational axis of the rolling bodies extends substantially in the transverse direction. This can constitute an independent solution for a low-friction movement of the power module, or also take place in combination with aforementioned embodiments. Likewise, the rolling bodies can be oriented substantially vertically with their rotational axis, whereby a low-friction guidance in or on the guide element is made possible.

In order to make the movement of the power module possible in a medium or high voltage converter, the formation of rolling bodies as an integral part of the cooling plate can be refrained from according to the invention. According to an advantageous further development, in this regard, at least one longitudinal beam of the rack is configured as a hollow body and has at least two passages for the passage, in each case, of at least one rolling body in a service position and one lifting tool insertable into the longitudinal beam in a rest position.

The functional principle of said lifting tool can be understood analogously to the above description of the adjustable rolling bodies of the cooling plate. However, in this embodiment, no rolling bodies remain within the rolling body during operation. The passages for the rolling bodies are provided on the longitudinal beam upwardly in the vertical direction, wherein the lifting tool supports itself on the inner side of the hollow body, downwardly in the vertical direction. According to the invention, the insertion of only one lifting tool into the hollow body provided therefor is only necessary in case of damage or service. This avoids the arrangement of movable and/or loose parts in the rack, which parts could prove disadvantageous particularly in the case of high voltage applications. Additionally, by avoiding known lifting devices and/or roller shutter systems on each individual receiving space of the rack, a reduction of the total weight of the medium or high voltage converter occurs. Moreover, only lifting tool is necessary for servicing a medium or high voltage converter, whereby the cost of purchase does not apply. Such a lifting tool can be operated manually and/or in a motorized manner for adjusting the rolling bodies from the rest position into the service position and back.

For the purpose of better understanding of the invention, it will be elucidated in more detail by means of the figures below.

These show in a respectively very simplified schematic representation:

FIG. 1 a schematic oblique view of a power module in a medium or high voltage converter;

FIG. 2 a schematic front view of different possible arrangements of energy storage modules and power semiconductor modules on the cooling plate of the power module (a) to (c);

FIG. 3 a schematic exploded view of a possible embodiment of a power module;

FIG. 4 a schematic oblique view of a power module having a retaining element and a corresponding coupling device on the rack;

FIG. 5 a schematic exploded view of a cooling plate made up of multiple cooling plate segments with different cooling capacities;

FIG. 6 a schematic view of a cutout of the support region of a cooling plate with adjustable rolling bodies in the rest position (a) and/or service position (b);

FIG. 7 a schematic sectional view of a power module in a hanging and/or standing support on the rack (a, b) as well as a schematic oblique view of a cutout of the rack with a lifting tool (c) insertable into the longitudinal beam.

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

FIG. 1 shows a schematic view of a medium or high voltage converter 2 with a power module 1 according to the invention. The concept according to the invention can also be envisaged for low voltage converters. The medium or high voltage converter 2 has a rack 3 which comprises a plurality of vertical standing members 24 and horizontal beams 25. The horizontal beams 25 are arranged for connecting at least two vertical standing members 24 each. The rack 3 has plurality of receiving spaces 23 which are designed for receiving at least one power module 1 each. The horizontal beams 25 arranged on the front and/or rear side are connected via longitudinal beams 26. The longitudinal beams 26 serve the load transfer of the power module 1 and can have one or multiple guide elements 22 on the upper side and/or bottom side.

Moreover, FIG. 1 shows that the power module 1 according to the invention has a cooling device 6 in the form of a load transferring cooling plate 7. The cooling plate 7 has, compared to its cooling plate length 8 and the cooling plate height 9 in the transverse direction 17, a smaller cooling plate thickness 10. The cooling plate 7 is designed for the load transfer of the power module 1 onto the rack 3, such that the load transfer can take place on at least one support region 12 of the cooling plate.

The operating principle of the load transfer of the power module 1 onto the rack 3 via the at least one support region 12, can be seen particularly well from a combination of FIGS. 2a to c and FIG. 7a. FIG. 1 further shows that at least two electrical connections 33 and/or control connections 36 and/or coolant connections 37 and/or possible measuring connections 34 and/or auxiliary connections 35 may be formed on the front side 41 of the power module 1. In the interest of brevity, the situation, in which a part of or all of the aforementioned connections may be formed on the rear side 47 of the power module, is not depicted.

FIGS. 2a to c schematically show different possible embodiments for arrangements of the at least one power semiconductor module 4 as well as the at least one energy storage module 5 on the cooling plate 7, although on principal, a one-sided arrangement of all components is also possible. From a combination with FIG. 3, it is clearly evident that a first and second side 13, 14 of the cooling plate 7 are defined by the cooling plate length 8 and the cooling plate height 9. On these first and second sides 13, 14, at least one receiving surface 18 for arranging at least one power semiconductor module 4 and/or at least one energy storage module 5 each can be provided. Likewise, further components, such as one or multiple auxiliary modules 21, can be arranged on the sides 13, 14 of the cooling plate.

FIG. 2a schematically depicts a situation, in which the energy storage module 5 is arranged on a first side 13 of the cooling plate 7, and a power semiconductor module 4 is arranged on the opposing second side 14.

FIG. 2b shows a further possible embodiment, in which, in each case, one power semiconductor module 4 as well as one energy storage module 5 are arranged on a first and second side 13, 14 of the cooling plate 7.

FIG. 2c shows a further possible embodiment, wherein power semiconductor modules 4 and energy storage modules 5 corresponding with one another are arranged on opposite sides of the cooling plate 7 and are, in each case, connected to one another by a connection opening 20.

For connecting the energy storage modules 5 to the corresponding power semiconductor module 4, it can be advantageous to provide connection openings 20 as they are shown particularly in FIG. 3, and in dashed lines in FIG. 2c. The embodiments shown in FIGS. 2a to c, show a load transfer of the power module 1 via a support region 12, which is formed as a support surface 19 on the bottom side of the cooling plate 7. Alternatively to this or in combination, reference is made to the discussion of FIGS. 7a to c.

FIG. 3 schematically shows an exploded view of an exemplary embodiment of a power module 1 according to the invention. As depicted, multiple power semiconductor modules 4 as well as one or multiple energy storage modules 5 can be arranged on receiving surfaces 18 provided therefor. The connection between said components and/or an auxiliary module 21 can be carried out via connection openings 20 provided therefor, so as to penetrate the cooling plate 7. Likewise, FIG. 3 makes evident that one or multiple protective housings 40 for receiving at least one power semiconductor module 4 and/or possible further components is configured so it can be affixed with the cooling plate 7. The power module 1 can therefore have one or multiple protective housings 40.

Moreover, FIG. 3 shows a preferred measure, which shows the formation of a bulkhead partition element 48 between two components on a side of the cooling plate 7. The bulkhead partition element 48 separates, by way of example, the power semiconductor modules 4 from the auxiliary module 21 and connects the cooling plate 7 to the integrally formed protective housing 40. The connection of the bulkhead partition element 48 and/or the protective housing 40 to the cooling plate 7 can preferably be made via threaded connections. Multiple such bulkhead partition elements 48 can also be provided on a first and/or second side 13, 14 of the cooling plate 7.

FIG. 4 shows an exemplary embodiment of a retaining element 39 arranged on the cooling plate 7, which retaining element 39 is configured so as to correspond with a coupling device 38 of the rack 3. In the depicted exemplary embodiment, the retaining element 39 is shown as a pin-shaped extension with a head broadened with respect to the pin diameter, which extension, upon lowering the power module 1, automatically arrests from the service position 31 into the rest position 32 with a coupling device 38 having a lug-type configuration. For the discussion of the functionality of the raising into the service position 31 and/or lowering into the rest position 32, reference is made to the discussion regarding FIGS. 6 and 7c.

FIG. 4 further shows that the power module 1 is guided in the support region 12 along the longitudinal beam 26. The depicted guide elements 22 as well as the retaining element 39 can, among other things, be used as a centering aid. Advantageously, the coupling device 38 is arranged on the horizontal beam 25. The retaining element 39 in the depicted form, or also in a functionally equivalent embodiment, can also serve as a type of end stop for avoiding damage to connections arranged on the rear side. As an alternative or in addition, one or multiple stop elements 42, as shown in FIG. 1, can be also arranged on the cooling plate 7.

FIG. 4 does not show possible retaining element which are configured as e.g. recesses and/or extensions protruding laterally on the cooling plate 7. The coupling devices 38 complementary in shape can, in this case, be formed to be actively actuated by an operator or to be automatic for arresting and/or releasing the power module 1.

In FIG. 4, electrical connections 33 are adumbrated by way of example, which can be arranged on the rear side 47 of the power module 1 and are representative of control connections 36, coolant connections 37 and the like. Based on this depiction, it is easily conceivable that, when moving the power module 1 in, in the longitudinal direction 15, a coupling of said connections to a supply platform, not depicted, can take place.

FIG. 5 shows a schematic exploded view of a possible embodiment of a cooling plate 7 formed by cooling plate segments 43. As shown, the cooling plate segments 43 can have differently arranged cooling channels 44, which, by assembling the cooling plate segments 43, form a closed cooling channel 44. As this schematic representation shows, the formation of the cooling plate 7 can take place by assembling multiple cooling plate segments 43. This allows easily realizing locally different cooling capacities at different cooling plate segments 43. In particular, a cooling plate 7 can be divided into cooling plate segments 43 in the transverse direction 17 and/or longitudinal direction 15 and/or vertical direction 16 for this.

In order to ease the exchange of a power module 1, it has proven advantageous if the cooling plate 7 is supported, in the support region 12, by rolling bodies 27 or sliding elements, not depicted, on the rack 3. FIGS. 6 and 7 show exemplary possible embodiments with different rolling body arrangements and/or raising and movement mechanisms.

In the simplest case, which is not shown, at least two rolling bodies 27 are arranged on at least one support region 12 in a rigid manner and facilitate movement in the longitudinal direction 15. In this regard, the arrangement of the rolling bodies 27 can take place on or within the cooling plate 7, or in a rolling body receptacle provided therefore, which is not separately shown, which rolling body receptacle ensures the load transfer of the power module 1 vie the cooling plate 7 and/or its support region 12.

FIGS. 6a and b show a possible arrangement of adjustable rolling bodies 27 in a service position 31 and/or rest position 32. The rolling bodies 27 are mounted in a support region 12 in a manner allowing them to protrude in the direction toward the bottom side with respect to the support surface 19. The operating principle of the relatively simple lifting mechanism is shown by way of example on a rolling body 27. The lever device 45 connects the rolling body 27 to a push rod 46, which is coupled with at least one second rolling body 27 and, in case of multiple rolling bodies 27, preferably with all rolling bodies 27. This arrangement may be arranged laterally or also inside the cooling plate 7. In FIG. 6a, the rolling body 27 in the rest position 32 is recessed completely behind the support surface 19. In this manner, the power module 1 can be supported on the support region 12 and/or the support surface 19 on the rack 3 and thus mounted in a static manner. The impact of a force, which is shown as a movement arrow in FIG. 6b, causes a movement of a push rod 46 in the longitudinal direction 15, whereby the rolling body 27 protrudes beyond the plane of the support surface 19, and the power module 1 can be raised by a few millimeters to centimeters. This way, the formation of rolling bodies 27 as an integral part of the support region 12 and/or of the cooling plate 7 can be used for an energy efficient exchange of the power module 1.

FIG. 7a schematically adumbrates a situation, in which at least two rolling bodies 27 are arranged in the support region 12 in the region of the upper side of the cooling plate 11. In this exemplary representation, the rolling bodies 27 are arranged on both sides of the cooling plate, although an arrangement on one side is also conceivable. Furthermore, it is evident from the representation that, in the region of the upper side of the cooling plate 11, the guide element 22 is formed as, for example, a C-shaped profile element and serves for receiving the rolling bodies 27, whereby a type of hanging arrangement of the power module 1 is made possible. Likewise, by such an arrangement of the rolling bodies 27, the positional stability of the power module 1 can be made largely independent of an elevated center of gravity position.

An alternative possible arrangement of rolling bodies 27 in the support region 12 can be seen from FIG. 7a, wherein the at least two rolling bodies 27 are arranged in the region of the bottom side of the cooling plate and are used for supporting the support surface 19. Such an arrangement can be formed individually or in combination with rolling bodies 27 which are arranged in the support region 12 on the upper side 11 of the cooling plate.

FIG. 7b shows an alternative and independent possibility for the arrangement of at least two rolling bodies 27 in at least one support region 12. The sectional view shows a rolling body 27, the rotational axis of which is aligned essentially in the vertical direction 16, in the region of the upper side 11 of the cooling plate. In this regard, essentially a lateral support of the cooling plate in the transverse direction 17 on the guide elements 22 provided for this purpose takes place. To avoid blocking of the rolling body 27 a small air gap should be provided. Alternatively, the formation of a sliding element in the upper support region 12 can be provided. However, in both cases, the formation of rolling bodies 27 and/or sliding elements on the bottom side of the cooling plate 7 can be required. A possible embodiment in this regard is shown in FIG. 7b in the region of the bottom side of the cooling plate, wherein a lifting tool 30 is inserted into the longitudinal beam 26 and has at least two rolling bodies 27.

The rolling bodies 27 of such a lifting tool 30 that can be inserted into a longitudinal beam 26 of the rack 3 are formed so as to be adjustable analogously to the description of the adjustable rolling bodies 27 in FIGS. 6a and b. Representation 7b shows the rolling body 27 in the service position 31 analogously to FIG. 6b. For the sake of clarity, reference is made to FIG. 7c in which a lifting tool 30 that can be introduced into a longitudinal beam 26 can better be seen in an oblique view. Such a lifting tool 30 comprises at least two adjustable rolling bodies 27, which act analogously but in the reversed direction of operation as in the described functional principle of the discussion of FIG. 6. To allow the rolling bodies 27 of the inserted lifting tool 30 to pass through the upper side of a longitudinal beam 26, passages 29 are provided. The longitudinal beam 26 is formed as a hollow body 28. The joint adjustment of the rolling bodies 27 of an external lifting tool 30 can be carried out manually or by motor. As a combination, in particular with FIG. 1, shows, such a lifting tool 30 can be used for all power modules 1 of a medium or high voltage converter 2. Moreover, by means of such a lifting tool 30, the formation of integral rolling bodies 27 on and/or within the cooling plate 7 can be prevented.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the teaching for technical action provided by the present invention lies within the ability of the person skilled in the art in this technical field.

The scope of protection is determined by the claims. However, the description and the drawings are to be adduced for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10.

Finally, as a matter of form, it should be noted that for ease of understanding of the structure, elements are partially not depicted to scale and/or are enlarged and/or are reduced in size.

| List of reference numbers | |
|---|---|
| 1 | power module |
| 2 | medium or high voltage converter |
| 3 | rack |
| 4 | power semiconductor module |
| 5 | energy storage module |
| 6 | cooling device |
| 7 | cooling plate |
| 8 | cooling plate length |
| 9 | cooling plate height |
| 10 | cooling plate thickness |
| 11 | cooling plate upper side |
| 12 | support region |
| 13 | first side |
| 14 | second side |
| 15 | longitudinal direction |
| 16 | vertical direction |
| 17 | transverse direction |
| 18 | receiving surface |
| 19 | support surface |
| 20 | connection opening |
| 21 | auxiliary module |
| 22 | guide element |
| 23 | receiving space |
| 24 | vertical standing member |
| 25 | horizontal beam |
| 26 | longitudinal beam |
| 27 | rolling body |
| 28 | hollow body |
| 29 | passage |
| 30 | lifting tool |
| 31 | service position |
| 32 | rest position |
| 33 | electrical connection |
| 34 | measuring connection |
| 35 | auxiliary connection |
| 36 | control connection |
| 37 | coolant connection |
| 38 | coupling device |
| 39 | retaining element |
| 40 | protective housing |
| 41 | front side |
| 42 | stop element |
| 43 | cooling plate segment |
| 44 | cooling channel |
| 45 | lever device |
| 46 | push rod |
| 47 | rear side |
| 48 | bulkhead partition element |

The invention claimed is:

1. A power module for a medium or high voltage converter, comprising:
at least one power semiconductor module,
at least one energy storage module, and
at least one cooling device, wherein:
the cooling device is formed as a cooling plate which can be run through by a coolant, and which has a smaller cooling plate thickness as compared to a cooling plate length and a cooling plate height, and the cooling plate has at least one support region defined by the cooling plate length and the cooling plate thickness and/or a part of the cooling plate height of the cooling plate, for load transfer of the power module onto a rack of the medium or high voltage converter,
the cooling plate has at least one receiving surface on both sides defined by the cooling plate length and the cooling plate height of the cooling plate, for arranging at least one power semiconductor module or at least one energy storage module,
the at least one power semiconductor module is arranged on a first side of the cooling plate, and the at least one energy storage module is arranged on a second side of the cooling plate opposite the first side, and the cooling plate includes at least one opening in a transverse direction for leading through and contacting at least electrical connections of the at least one energy storage module to the at least one power semiconductor module and/or at least one auxiliary module.

2. The power module according to claim 1, wherein the at least one support region for the supporting load transfer onto the rack, substantially downward in the vertical direction, is designed as a support surface comprising at least the cooling plate length and cooling plate thickness.

3. The power module according to claim 1, wherein the at least one support region for the load transfer onto the rack is formed in the region of an upper side of the cooling plate comprising at least the cooling plate length and a part of the cooling plate height.

4. The power module according to claim 1, wherein at least one retaining element corresponding with a coupling device of the rack is arranged on the cooling plate.

5. A power module for a medium or high voltage converter, comprising:
at least one power semiconductor module;
at least one energy storage module; and
at least one cooling device, wherein:
the cooling device is formed as a cooling plate which can be run through by a coolant, and which has a smaller cooling plate thickness as compared to a cooling plate length and a cooling plate height, and the cooling plate has at least one support region defined by the cooling plate length and the cooling plate thickness and/or a part of the cooling plate height of the cooling plate, for load transfer of the power module onto a rack of the medium or high voltage converter,
the cooling plate has at least one receiving surface on both sides defined by the cooling plate length and the cooling plate height of the cooling plate, for arranging at least one power semiconductor module or at least one energy storage module, and
the at least one power semiconductor module is arranged on a first side of the cooling plate, and the at least one energy storage module is arranged on a second side of the cooling plate opposite the first side;
at least one protective housing affixable to the cooling plate for accommodating at least one power semiconductor module and/or auxiliary module and/or energy storage module; and
at least one bulkhead partition element arranged so as to separate at least two electrical components of the power module, and so as to connect the cooling plate to the at least one protective housing.

6. The power module according to claim 1, wherein at least two electrical connections and/or control connections and/or coolant connections and/or possible measuring connections and/or auxiliary connections are formed on a front side of the power module.

7. The power module according to claim 1, wherein at least two electrical connections and/or control connections and/or coolant connections and/or possible measuring connections and/or auxiliary connections are formed on a rear side of the power module.

8. A power module for a medium or high voltage converter, comprising:
at least one power semiconductor module,
at least one energy storage module,
at least one cooling device, wherein:
the cooling device is formed as a cooling plate which can be run through by a coolant, and which has a smaller cooling plate thickness as compared to a cooling plate length and a cooling plate height, and the cooling plate has at least one support region defined by the cooling plate length and the cooling plate thickness and/or a part of the cooling plate height of the cooling plate, for load transfer of the power module onto a rack of the medium or high voltage converter,
the cooling plate is assembled of at least two cooling plate segments divided in the longitudinal direction and/or the transverse direction and/or the vertical direction, for the formation of a continuous coolant channel, at least two of the cooling plate segments having different cooling capacities,
the cooling plate has at least one receiving surface on both sides defined by the cooling plate length and the cooling plate height of the cooling plate, for arranging at least one power semiconductor module or at least one energy storage module, and
the at least one power semiconductor module is arranged on a first side of the cooling plate, and the at least one energy storage module is arranged on a second side of the cooling plate opposite the first side.

9. The power module according to claim 1, wherein the cooling plate is designed so as to protrude in a vertical direction relative to the at least one power semiconductor module and/or the at least one energy storage module and/or at least one protective housing.

10. A power module for a medium or high voltage converter, comprising:
at least one power semiconductor module,
at least one energy storage module, and
at least one cooling device, wherein:
the cooling device is formed as a cooling plate which can be run through by a coolant, and which has a smaller cooling plate thickness as compared to a cooling plate length and a cooling plate height, and the cooling plate has a support region defined by the cooling plate length and the cooling plate thickness and/or a part of the cooling plate height of the cooling plate, for load transfer of the power module onto a rack of the medium or high voltage converter,
the cooling plate has at least one receiving surface on both sides defined by the cooling plate length and the cooling plate height of the cooling plate, for arranging at least one power semiconductor module or at least one energy storage module, and
the at least one power semiconductor module is arranged on a first side of the cooling plate, and the at least one energy storage module is arranged on a second side of the cooling plate opposite the first side, and
in the support region of the cooling plate, at least two rolling bodies are formed on the cooling plate or on a rolling body receptacle provided for this purpose.

11. A medium or high voltage converter, comprising:
at least one power module including:
at least one power semiconductor module;
at least one energy storage module; and
at least one cooling device; and
a rack having a plurality of vertical standing members and horizontal beams, which are arranged for connecting to at least two vertical standing members each, and which rack has at least one receiving space for the at least one power module, wherein at least one longitudinal beam is arranged so as to connect at least two horizontal beams for the load transfer of the power module, and wherein:

the cooling device is formed as a cooling plate which can be run through by a coolant, and which has a smaller cooling plate thickness as compared to a cooling plate length and a cooling plate height, and the cooling plate has at least one support region defined by the cooling plate length and the cooling plate thickness and/or a part of the cooling plate height of the cooling plate, for load transfer of the power module onto the rack, the cooling plate has at least one receiving surface on both sides defined by the cooling plate length and the cooling plate height of the cooling plate, for arranging at least one power semiconductor module or at least one energy storage module, and the at least one power semiconductor module is arranged on a first side of the cooling plate, and the at least one energy storage module is arranged on a second side of the cooling plate opposite the first side.

12. The medium or high voltage converter according to claim 11, wherein at least one of the horizontal beams and/or at least one of the longitudinal beams are made from an electrically insulating material.

13. The medium or high voltage converter according to claim 11, wherein the at least one longitudinal beam is configured as a hollow body and has at least two passages for the passage, in each case, of at least one rolling body in a service position and one lifting tool insertable into the longitudinal beam in a rest position.

14. The medium or high voltage converter according to claim 11, wherein the at least one longitudinal beam comprises at least one guide element for guiding the cooling plate at least in the transverse direction.

15. The medium or high voltage converter according to claim 11, wherein at least one guide element is configured as a Z-shaped, L-shaped, C-shaped or U-shaped profile element on a bottom side of at least one longitudinal beam for accommodating the support region and/or guiding the cooling plate.

16. The power module of claim 1, wherein the medium or high voltage converter includes a modular multilevel converter.

17. The medium or high voltage converter of claim 12, wherein the electrically insulating material includes a glass fiber composite material.

18. The power module according to claim 5, wherein at least two electrical connections and/or control connections and/or coolant connections and/or possible measuring connections and/or auxiliary connections are formed on a front side of the power module.

19. The power module according to claim 8, wherein at least two electrical connections and/or control connections and/or coolant connections and/or possible measuring connections and/or auxiliary connections are formed on a front side of the power module.

20. The power module according to claim 10, wherein at least two electrical connections and/or control connections and/or coolant connections and/or possible measuring connections and/or auxiliary connections are formed on a front side of the power module.

* * * * *